(12) United States Patent
Chen

(10) Patent No.: US 10,236,880 B2
(45) Date of Patent: Mar. 19, 2019

(54) LIGHT EMITTING SLIM KEY STRUCTURE

(71) Applicant: PRIMAX ELECTRONICS LTD., Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 139 days.

(21) Appl. No.: 15/397,503

(22) Filed: Jan. 3, 2017

(65) Prior Publication Data

US 2018/0123586 A1    May 3, 2018

(30) Foreign Application Priority Data

Oct. 28, 2016  (TW) .............................. 105135081 A

(51) Int. Cl.
*H03K 17/96*    (2006.01)
*H03K 17/968*   (2006.01)
*H03K 17/94*    (2006.01)

(52) U.S. Cl.
CPC ........... *H03K 17/968* (2013.01); *H03K 17/94* (2013.01)

(58) Field of Classification Search
CPC ... H03K 17/78; H03K 17/969; G02B 19/0061
See application file for complete search history.

(56) References Cited

U.S. PATENT DOCUMENTS

2012/0018637 A1*  1/2012  Mitani ................. H03K 17/941
                                                 250/339.02

FOREIGN PATENT DOCUMENTS

CA          2915340      * 12/2015

* cited by examiner

*Primary Examiner* — Tony Ko
(74) *Attorney, Agent, or Firm* — Kirton McConkie; Evan R. Witt

(57) ABSTRACT

A key structure includes a pedestal, an upper cover, a light-emitting element, a triggering element, an array-type sensing element and a control unit. The light-emitting element emits a light beam. The triggering element is arranged between the pedestal and the upper cover. The triggering element includes a reflecting part. The light-emitting element and the array-type sensing element are located under the reflecting part. When the key structure is depressed, the key structure is moved relative to the pedestal. The light beam from the light-emitting element is reflected by the reflecting part and then received by the array-type sensing element. As the triggering element is moved, the array-type sensing element generates plural images. The control unit generates a corresponding pressure sensing signal according to the plural images.

7 Claims, 5 Drawing Sheets

LIGHT EMITTING SLIM KEY STRUCTURE

FIELD OF THE INVENTION

The present invention relates to a key structure, and more particularly to a mechanical key structure.

BACKGROUND OF THE INVENTION

Generally, the widely-used peripheral input device of a computer system includes for example a mouse, a keyboard, a trackball, or the like. Via the keyboard, characters or symbols can be directly inputted into the computer system. As a consequence, most users and most manufacturers of input devices pay much attention to the development of keyboards. As known, a keyboard with scissors-type connecting elements is one of the widely-used keyboards.

Hereinafter, a key structure with a scissors-type connecting element of a conventional keyboard will be illustrated with reference to FIG. 1. FIG. 1 is a schematic side cross-sectional view illustrating a conventional key structure. As shown in FIG. 1, the conventional key structure 1 comprises a keycap 11, a scissors-type connecting element 12, a rubbery elastomer 13, a membrane switch circuit member 14 and a base plate 15. The keycap 11, the scissors-type connecting element 12, the rubbery elastomer 13 and the membrane switch circuit member 14 are supported by the base plate 15. The scissors-type connecting element 12 is used for connecting the base plate 15 and the keycap 11.

The membrane switch circuit member 14 comprises plural key intersections (not shown). When one of the plural key intersections is triggered, a corresponding key signal is generated. The rubbery elastomer 13 is disposed on the membrane switch circuit member 14. Each rubbery elastomer 13 is aligned with a corresponding key intersection. When the rubbery elastomer 13 is depressed, the rubbery elastomer 13 is subjected to deformation to push the corresponding key intersection of the membrane switch circuit member 14. Consequently, the corresponding key signal is generated.

The scissors-type connecting element 12 is arranged between the base plate 15 and the keycap 11, and the base plate 15 and the keycap 11 are connected with each other through the scissors-type connecting element 12. The scissors-type connecting element 12 comprises a first frame 121 and a second frame 122. A first end of the first frame 121 is connected with the keycap 11. A second end of the first frame 121 is connected with the base plate 15. The rubbery elastomer 13 is enclosed by the scissors-type connecting element 12. Moreover, the first frame 121 comprises a first keycap post 1211 and a first base plate post 1212. The first frame 121 is connected with the keycap 11 through the first keycap post 1211. The first frame 121 is connected with the base plate 15 through the first base plate post 1212. The second frame 122 is combined with the first frame 121. A first end of the second frame 122 is connected with the base plate 15. A second end of the second frame 122 is connected with the keycap 11. Moreover, the second frame 122 comprises a second keycap post 1221 and a second base plate post 1222. The second frame 122 is connected with the keycap 11 through the second keycap post 1221. The second frame 122 is connected with the base plate 15 through the second base plate post 1222.

The operations of the conventional key structure 1 in response to the depressing action of the user will be illustrated as follows. Please refer to FIG. 1 again. When the keycap 11 is depressed, the keycap 11 is moved downwardly to push the scissors-type connecting element 12 in response to the depressing force. As the keycap 11 is moved downwardly relative to the base plate 15, the keycap 11 pushes the corresponding rubbery elastomer 13. At the same time, the rubbery elastomer 13 is subjected to deformation to push the membrane switch circuit member 14 and trigger the corresponding key intersection of the membrane switch circuit member 14. Consequently, the membrane switch circuit member 14 generates a corresponding key signal. When the keycap 11 is no longer depressed by the user, no external force is applied to the keycap 11 and the rubbery elastomer 13 is no longer pushed by the keycap 11. In response to the elasticity of the rubbery elastomer 13, the rubbery elastomer 13 is restored to its original shape to provide an upward elastic restoring force. Consequently, the keycap 11 is returned to its original position where it is not depressed.

With increasing development of science and technology, a mechanical key structure is introduced into the market. FIG. 2 is a schematic exploded view illustrating a conventional mechanical key structure. As shown in FIG. 2, the mechanical key structure 2 comprises a keycap (not shown), a pedestal 21, an upper cover 22, a push element 23, a linkage element 24, a first spring strip 25, a second spring strip 26 and a circuit board (not shown). The pedestal 21 is covered by the upper cover 22. The upper cover 22 has an opening 221. The linkage element 24 is located at a middle region of the pedestal 21. Moreover, the linkage element 24 is movable upwardly or downwardly relative to the pedestal 21. The first spring strip 25 is partially disposed within the pedestal 21, and located near a sidewall of the pedestal 21. The second spring strip 26 is partially disposed within the pedestal 21, and arranged between the linkage element 24 and the first spring strip 25. The push element 23 and the linkage element 24 are collaboratively disposed on the pedestal 21. The push element 23 is penetrated through the opening 221 and coupled with the keycap. Moreover, the first spring strip 25 and the second spring strip 26 are electrically connected with the circuit board.

Please refer to FIG. 2 again. The linkage element 24 has a protrusion structure 241. The protrusion structure 241 is extended from a sidewall of the linkage element 24 toward the first spring strip 25. Moreover, the first spring strip 25 comprises a fixing part 251 and an elastic part 252. The fixing part 251 is fixed on the pedestal 21. The elastic part 252 is extended from the fixing part 251. Moreover, the elastic part 252 is contacted with the protrusion structure 241 of the linkage element 24. Consequently, the elastic part 252 is movable relative to the fixing part 251.

When the keycap is depressed, the keycap is moved downwardly to push the push element 23. Consequently, the linkage element 24 connected with the push element 23 is moved downwardly. As the linkage element 24 is moved downwardly, the protrusion structure 241 of the linkage element 24 is contacted with the elastic part 252 and moved downwardly along the elastic part 252. While the linkage element 24 is quickly moved in response to the depressing force of the user, the linkage element 24 is quickly moved across the elastic part 252, and the elastic part 252 is pushed by the protrusion structure 241 of the linkage element 24. Consequently, the elastic part 252 is moved relative to the fixing part 251 to collide with the second spring strip 26. Since the first spring strip 25 and the second spring strip 26 are contacted with each other, the circuit board outputs a corresponding key signal. Moreover, while the first spring strip 25 and the second spring strip 26 are contacted with each other, a click sound is generated. Due to the click sound, the user can feel the depressing feedback.

Since the mechanical key structure 2 generates the click sound to provide the feedback feel while the keycap is depressed, the mechanical key structure 2 is favored by many users. However, the conventional mechanical key structure 2 still has some drawbacks. For example, since the push element 23 and the linkage element 24 are coupled with each other, the push element 23 should have a position-limiting structure to limit the movement of the linkage element 24. Under this circumstance, the thicknesses of the push element 23 and the linkage element 24 cannot be effectively reduced. Consequently, the volume of the mechanical key structure 2 cannot be effectively reduced.

Therefore, there is a need of providing a key structure with reduced volume.

SUMMARY OF THE INVENTION

The present invention provides a key structure with reduced volume.

In accordance with an aspect of the present invention, there is provided a key structure. The key structure includes a pedestal, an upper cover, a first light-emitting element, a triggering element, an array-type sensing element and a control unit. The pedestal includes a first pedestal opening. The upper cover has an upper cover opening. The pedestal is covered by the upper cover. The first light-emitting element is located under the pedestal, and emits a first light beam. The first light beam passes through the first pedestal opening. The triggering element is arranged between the pedestal and the upper cover. When the triggering element is depressed, the triggering element is moved relative to the pedestal. The triggering element includes a reflecting part. The first light beam is reflected by the reflecting part. The array-type sensing element is located under the pedestal, and aligned with the first pedestal opening. After the first light beam reflected by the reflecting part is received by the array-type sensing element, the array-type sensing element generates plural images. The array-type sensing element includes plural micro sensors that are arranged in an array. The control unit is electrically connected with the array-type sensing element. The control unit generates a corresponding pressure sensing signal according to the plural images.

From the above descriptions, the key structure of the present invention is triggered according to the optical technology in order to generate multifunction pressure sensing signals. Since the array-type sensing element is employed to replace the sensing element of the conventional key structure, the optical resolution of the image is increased according to the technology of the present invention. That is, the control unit can perform precise judgment to generate the corresponding pressure sensing signals. The way of using the optical triggering technology has some other benefits. For example, since the conventional mechanical triggering structure is not installed in the limited inner space of the key structure, the layout space is saved and the overall volume is reduced. Consequently, the key structure can meet the slimness requirement, and the drawbacks of the conventional technologies are effectively overcome.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technologies, the present invention provides a key structure with reduced volume.

Figure 1:
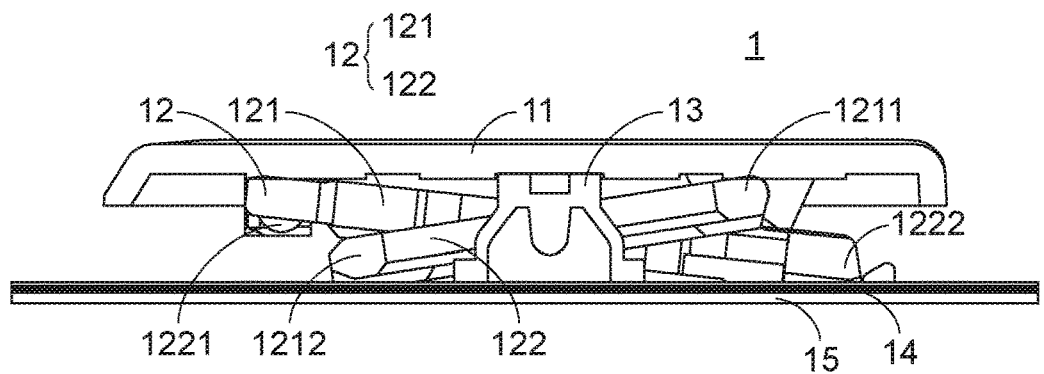
FIG. 1 is a schematic side cross-sectional view illustrating a conventional key structure.
Figure 2:
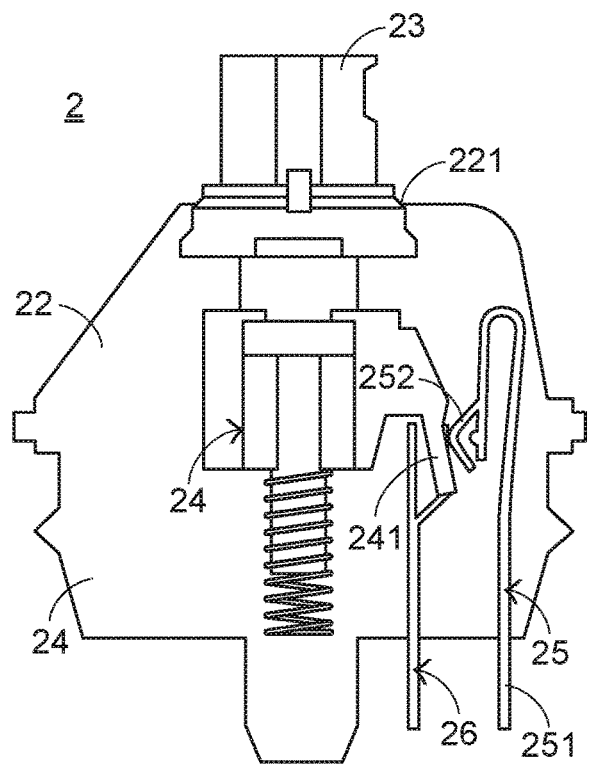
FIG. 2 is a schematic exploded view illustrating a conventional mechanical key structure.
Figure 3:
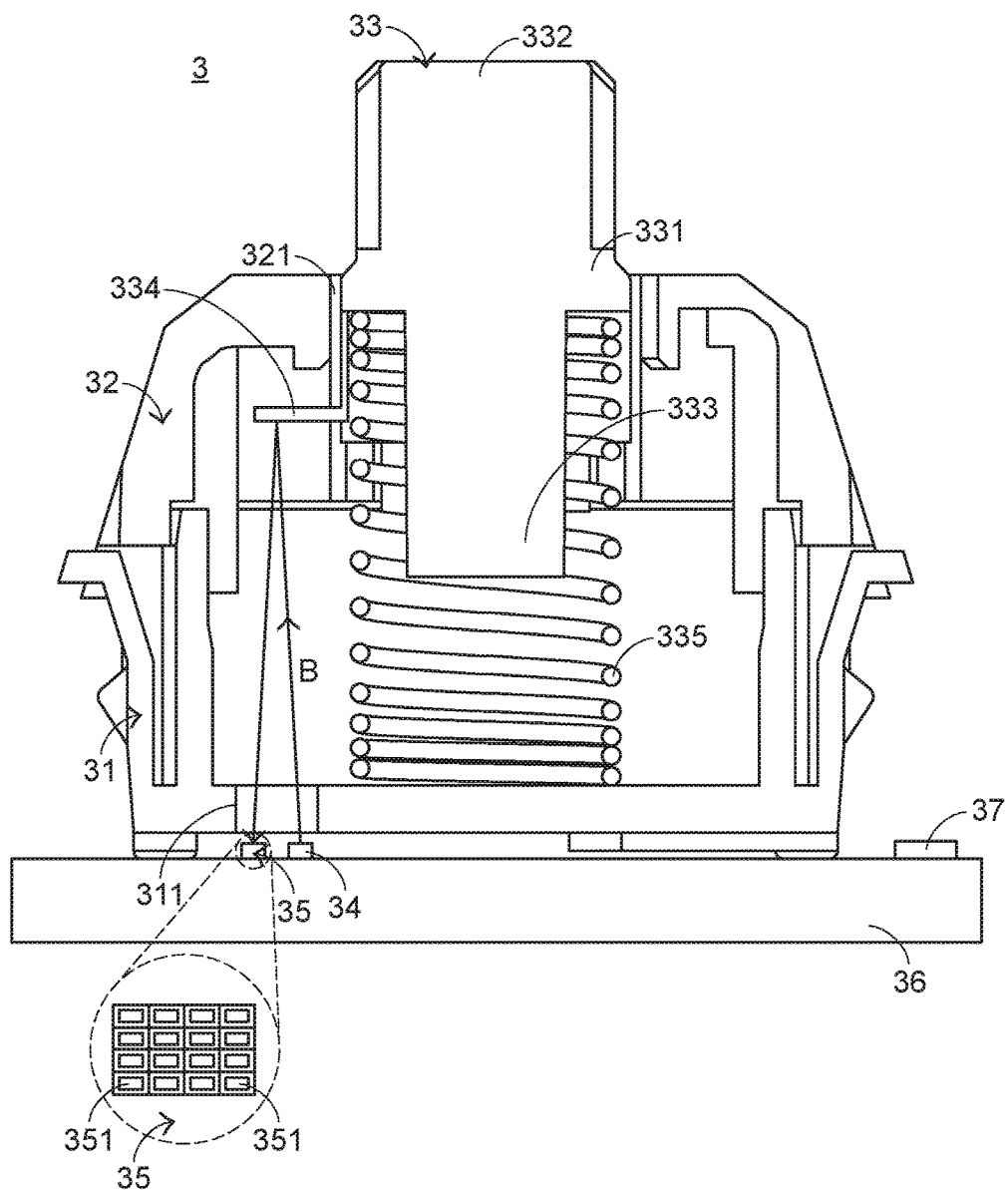
FIG. 3 is a schematic cross-sectional view illustrating a key structure according to a first embodiment of the present invention.

FIG. 3 is a schematic cross-sectional view illustrating a key structure according to a first embodiment of the present invention. As shown in FIG. 3, the key structure 3 comprises a pedestal 31, an upper cover 32, a triggering element 33, a light-emitting element 34, an array-type sensing element 35, a circuit board 36 and a control unit 37. The pedestal 31 has a pedestal opening 311. The pedestal opening 311 is located at a lower portion of the pedestal 31. The pedestal 31 is covered by the upper cover 32. Moreover, the upper cover 32 has an upper cover opening 321. The light-emitting element 34 is located under the pedestal 31 and disposed on a top surface of the circuit board 36. The light-emitting element 34 is aligned with the pedestal opening 311. The light-emitting element 34 emits a light beam B. The light beam B passes through the pedestal opening 311. The triggering element 33 is arranged between the pedestal 31 and the upper cover 32. When the triggering element 33 is depressed by the user, the triggering element 33 is moved relative to the pedestal 31. The array-type sensing element 35 is located under the pedestal 31, and aligned with the pedestal opening 311. After the light beam B is received by the array-type sensing element 35, the array-type sensing element 35 generates plural images. In an embodiment, the array-type sensing element 35 comprises plural micro sensors 351 that are arranged in an array.

The control unit 37 is disposed on the top surface of the circuit board 36 and electrically connected with the array-type sensing element 35. After the plural images are received, the control unit 37 generates a corresponding pressure sensing signal. The circuit board 36 is located under the pedestal 31. The light-emitting element 34, the array-type sensing element 35 and the control unit 37 are supported by the circuit board 36. In an embodiment, the light-emitting element 34 is a light emitting diode, the control unit 37 is a microprocessor, and the circuit board 36 is a printed circuit board (PCB) flexible printed circuit (FPC).

The structure of the triggering element 33 will be described as follows. As shown in FIG. 3, the triggering element 33 comprises a main body 331, a first coupling part 332, a second coupling part 333, a reflecting part 334 and an elastic part 335. The main body 331 is movable relative to the pedestal 31. The first coupling part 332 is located at a first end of the main body 331, penetrated through the upper cover opening 321, and connected with a keycap (not shown). The second coupling part 333 is located at a second end of the main body 331. The reflecting part 334 is extended externally from the main body 331 and aligned with the pedestal opening 311. The reflecting part 334 is used for reflecting the light beam B. The elastic part 335 is sheathed around the second coupling part 333 and contacted with the pedestal 31. In response to an elastic force of the elastic part 335, the main body 331 is moved relative to the pedestal 31 and returned to its original position. In an embodiment, the reflecting part 334 is a reflective mirror. Moreover, the reflecting part 334 has a flat reflective surface. The elastic part 335 is a helical spring. The main body 331, the first coupling part 332, the second coupling part 333 and the reflecting part 334 are integrally formed. Moreover, the reflecting part 334 is formed by a double injection process. It is noted that numerous modifications and alterations may be made while retaining the teachings of the invention. For example, in another embodiment, the first coupling part, the second coupling part and the reflecting part are individual components and assembled with the main body.

Figure 4:
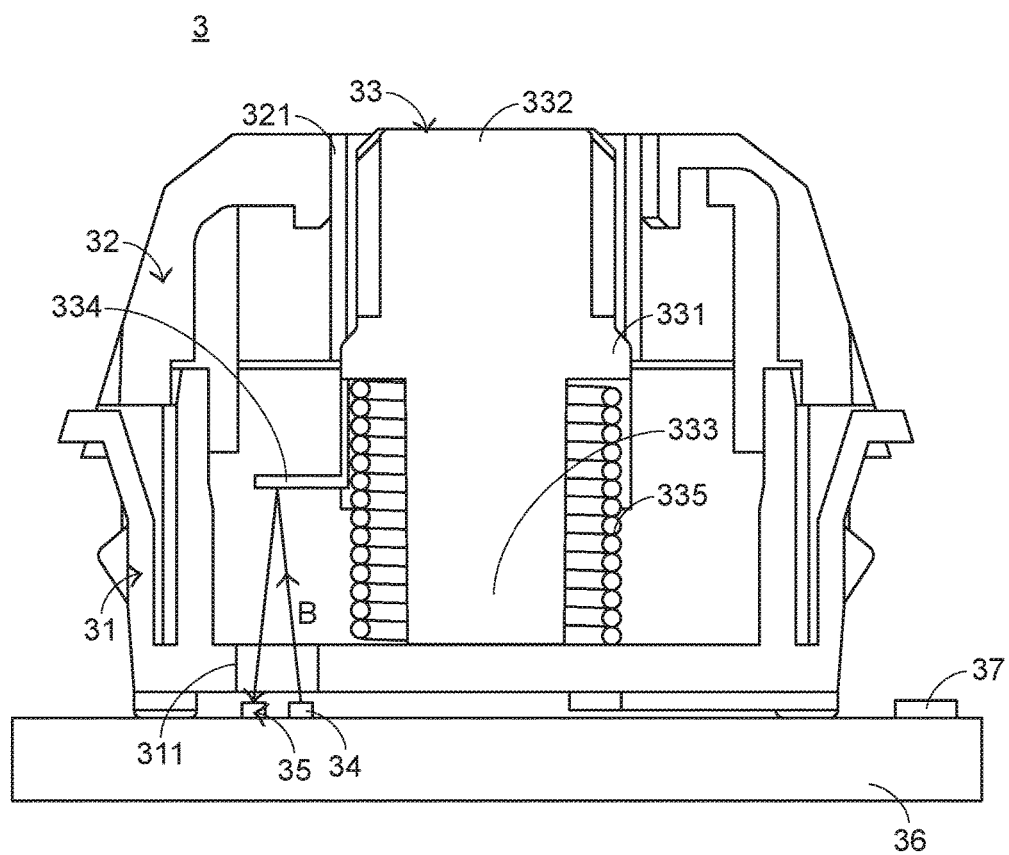
FIG. 4 is a schematic cross-sectional view illustrating the key structure according to the first embodiment of the present invention, in which the keycap is depressed.

The operations of the key structure 3 in response to the depressing action of the user will be illustrated as follows. Please refer to FIGS. 3 and 4. FIG. 4 is a schematic cross-sectional view illustrating the key structure according to the first embodiment of the present invention, in which the keycap is depressed. Before the keycap is depressed, the light beam B from the light-emitting element 34 is transmitted through the pedestal opening 311 and projected on the reflecting part 334. After the light beam B is reflected by the reflecting part 334, the reflected light beam B is received by the array-type sensing element 35. Consequently, the image of the reflecting part 334 in a non-depressed state is generated by the array-type sensing element 35.

The keycap is connected with the triggering element 33. While the keycap is depressed by the user, the keycap is moved downwardly to push the triggering element 33 in response to the depressing force. As the keycap is moved downwardly, the triggering element 33 is moved downwardly relative to the pedestal 31. While the triggering element 33 is moved downwardly, the light-emitting element 34 continuously emits the light beam B. After the light beam B is reflected by the reflecting part 334, the reflected light beam B is received by the array-type sensing element 35. Consequently, the image of the reflecting part 334 in a depressed state is generated by the array-type sensing element 35. Then, the image of the reflecting part 334 in the non-depressed state and the image of the reflecting part 334 in the depressed state are compared with each other by the control unit 37. According to the comparing result, the control unit 37 calculates a moving speed of the reflecting part 334. Moreover, according to the moving speed of the reflecting part 334, the control unit 37 generates the corresponding pressure sensing signal.

When the keycap is no longer depressed by the user, no external force is applied to the keycap. In response to the elasticity of the elastic part 335, the compressed elastic part 335 is restored to its original shape to provide an upward elastic force to the second coupling part 333. In response to the upward elastic force, the keycap is returned to its original position where it is not depressed. Consequently, the purpose of returning the key structure to its original position is achieved.

In accordance with a feature of the present invention, a predetermined light depressing data corresponding to the action of lightly depressing the key structure 3 and a predetermined heavy depressing data corresponding to the action of heavily depressing the key structure 3 are previously stored in the control unit 37. For example, if the control unit 37 detects a small image difference according to the comparing result, it means that the reflecting part 334 is moved at a slower speed. Meanwhile, the control unit 37 judges that the key structure 3 is depressed by the user lightly. Whereas, if the control unit 37 detects a large image difference according to the comparing result, it means that the reflecting part 334 is moved at a faster speed. Meanwhile, the control unit 37 judges that the key structure 3 is depressed by the user heavily.

By the above judging mechanism, the control unit issues the pressure sensing signal corresponding to the light depressing action or the pressure sensing signal corresponding to the heavy depressing action. That is, the key structure 3 of the present invention is trigged according to an optical technology. Since the way of triggering the key structure 3 is not restricted by the mechanical structure, the volume of the key structure 3 is reduced.

Figure 5:
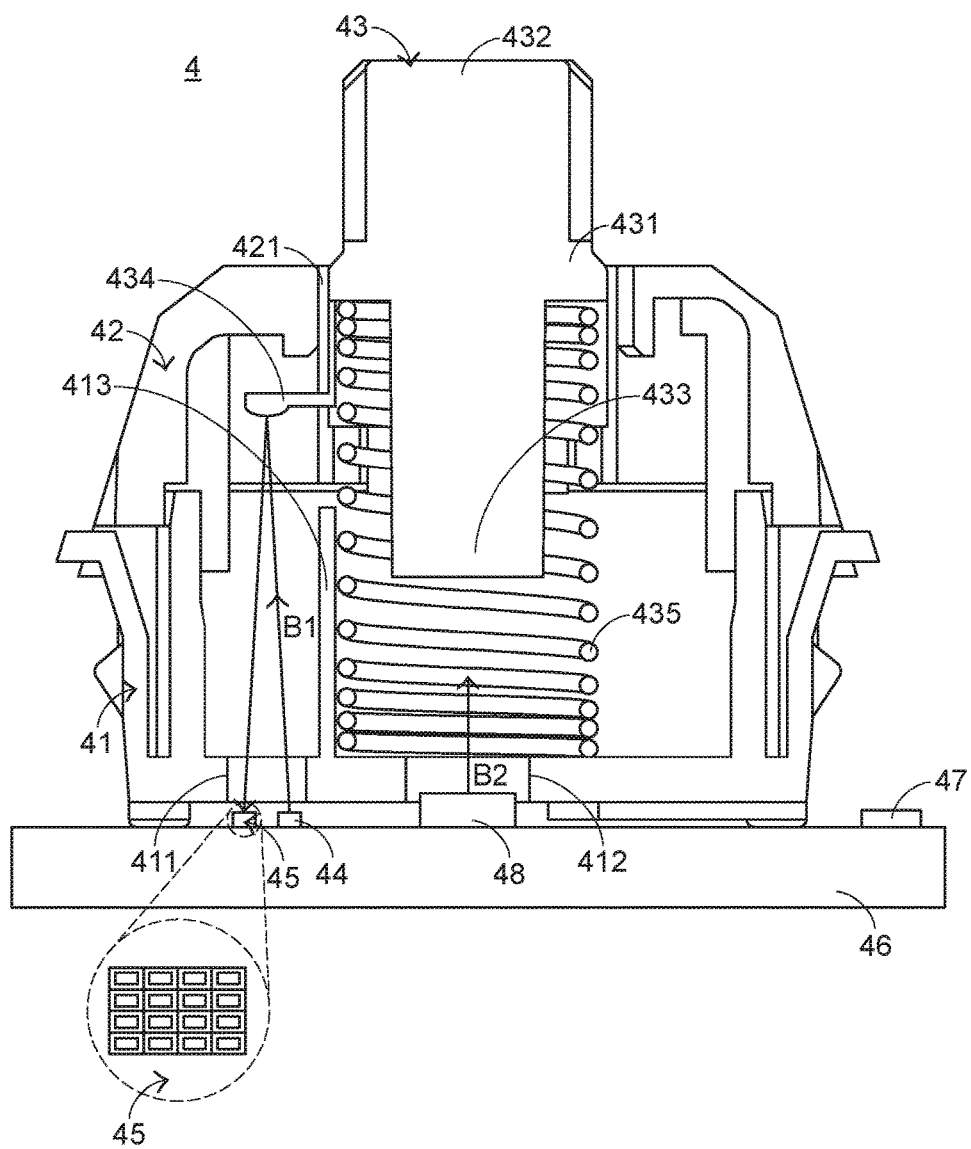
FIG. 5 is a schematic cross-sectional view illustrating a key structure according to a second embodiment of the present invention.

The present invention further provides a second embodiment, which is distinguished from the first embodiment. FIG. 5 is a schematic cross-sectional view illustrating a key structure according to a second embodiment of the present invention. As shown in FIG. 5, the key structure 4 comprises a keycap (not shown), a pedestal 41, an upper cover 42, a triggering element 43, a first light-emitting element 44, an array-type sensing element 45, a circuit board 46, a control unit 47 and a second light-emitting element 48. The first light-emitting element 44 emits a first light beam B1. The second light-emitting element 48 emits a second light beam B2. The upper cover 42 has an upper cover opening 421. The triggering element 43 comprises a main body 431, a first coupling part 432, a second coupling part 433, a reflecting part 434 and an elastic part 435. The structures and functions of the components of the key structure 4 which are identical to those of the first embodiment are not redundantly described herein. In comparison with the first embodiment, the key structure 4 of this embodiment has the following three distinguished aspects. Firstly, the key structure 4 further comprises the second light-emitting element 48. Secondly, the structures of the pedestal 41 and the triggering element 43 are changed in response to the arrangement of the second light-emitting element 48. Thirdly, the structure of the reflecting part 434 is distinguished.

As shown in FIG. 5, the second light-emitting element 48 is disposed on a top surface of the circuit board 46 for emitting the second light beam B2. The second light beam B2 is transmitted through the triggering element 43 to illuminate the keycap. The pedestal 41 comprises a first pedestal opening 411, a second pedestal 412 and a partition wall 413. The first pedestal opening 411 and the second pedestal 412 are formed in a lower portion of the pedestal 41. The first pedestal opening 411 is aligned with the first light-emitting element 44 and the array-type sensing element 45. The second pedestal 412 is aligned with the second light-emitting element 48. The second light beam B2 from the second light-emitting element 48 is projected to the triggering element 43 through the second pedestal 412. The partition wall 413 is formed on the lower portion of the pedestal 41, and arranged between the first light-emitting element 44 and the second light-emitting element 48. The first light beam B1 and the second light beam B2 are blocked by the partition wall 413. Consequently, the first light beam B1 and the second light beam B2 are not mixed. In other words, the partition wall 413 can block the first light beam B1 and the second light beam B2 in order to avoid the inference between the first light beam B1 and the second light beam B2.

In this embodiment, the second light-emitting element 48 is also a light emitting diode. Moreover, the main body 431, the first coupling part 432 and the second coupling part 433 are made of a light-transmissible material or a light-guiding material. Consequently, the second light beam B2 is transmissible through the triggering element 43. In this embodiment as shown in FIG. 5, the reflective surface of the reflecting part 434 is a curvy surface. It is noted that the profile of the reflective surface of the reflecting part is not restricted. For example, in another embodiment, the reflective surface of the reflecting part is a slant surface according to the practical requirements. Alternatively, plural microstructures are formed on the reflective surface of the reflecting part in order to achieve the required reflecting efficacy.

The following two aspects should be specially described. Firstly, the reflecting part is not restricted to the reflective mirror. In some other embodiments, a high reflectivity layer is coated or deposited on a protrusion structure of the main body and formed as the reflective surface of the reflecting part. Secondly, the first light-emitting element, the array-type sensing element, the control unit and the second light-emitting element are not restricted to be disposed on the top surface of the circuit board. In some other embodiments, the first light-emitting element, the array-type sensing element, the control unit and the second light-emitting element are disposed on a bottom surface of the circuit board and electrically connected with the circuit board. Moreover, the circuit board should have corresponding circuit openings. The first light beam from the first light-emitting element and the second light beam from the second light-emitting element pass through the corresponding circuit board openings.

In this embodiment, the key structure 4 is triggered according to the cooperation of the triggering element 43, the first light-emitting element 44 and the array-type sensing element 45. The operating principles of triggering the key structure 4 are similar to those of the above embodiment, and are not redundantly described herein. Moreover, the key structure 4 of this embodiment is further equipped with the second light-emitting element 48 and the light-transmissible and light-guiding triggering element 44. Consequently, the key structure has a luminous efficacy for meet the user's requirements.

Figure 6:
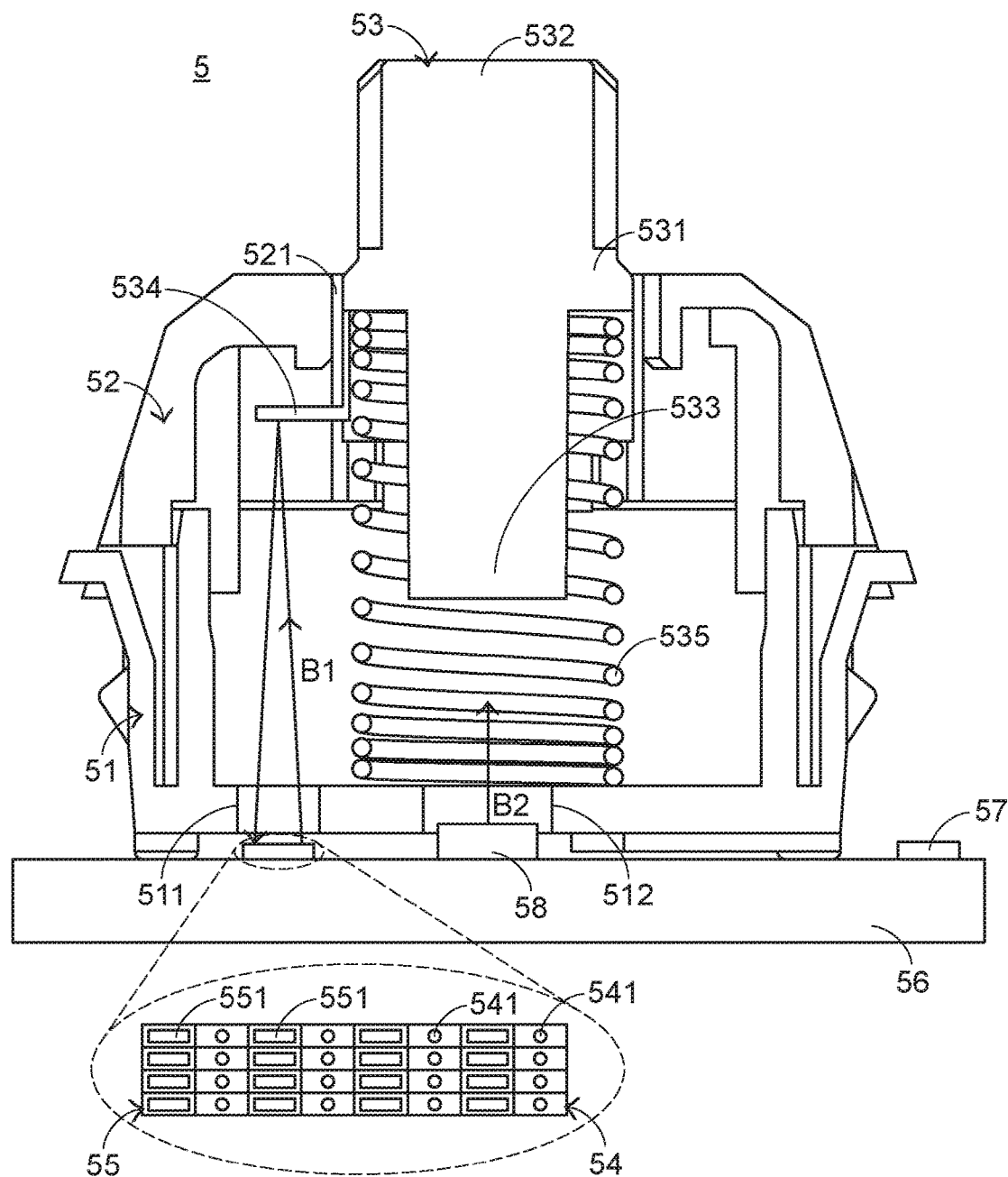
FIG. 6 is a schematic cross-sectional view illustrating a key structure according to a third embodiment of the present invention.

The present invention further provides a third embodiment, which is distinguished from the above embodiments. FIG. 6 is a schematic cross-sectional view illustrating a key structure according to a third embodiment of the present invention. As shown in FIG. 6, the key structure 5 comprises a keycap (not shown), a pedestal 51, an upper cover 52, a triggering element 53, an array-type light-emitting element 54, an array-type sensing element 55, a circuit board 56, a control unit 57 and a light-emitting element 58. The upper cover 52 has an upper cover opening 521. The pedestal 51 comprises a first pedestal 511 and a second pedestal 512. The triggering element 53 comprises a main body 531, a first coupling part 532, a second coupling part 533, a reflecting part 534 and an elastic part 535. The structures and functions of the components of the key structure 5 which are identical to those of the first embodiment are not redundantly described herein. In comparison with the above two embodiments, the key structure 5 of this embodiment has the following two distinguished aspects. Firstly, the light-emitting element for emitting the first light beam is replaced by the array-type light-emitting element 54. Secondly, the pedestal 51 is not equipped with the partition wall.

In this embodiment, the key structure 5 is triggered according to the cooperation of the triggering element 53, the array-type light-emitting element 54 and the array-type sensing element 55. The operating principles of triggering the key structure 5 are similar to those of the above embodiment, and are not redundantly described herein.

In this embodiment, the array-type light-emitting element 54 comprises plural micro light sources 541 that are arranged in an array. Consequently, the image generated by the array-type light-emitting element 54 has higher resolution. Under this circumstance, the judging result of the control unit is more precise, and multi-stage pressure sensing signals can be generated. That is, the pressure sensing function of the key structure 5 is enhanced.

In this embodiment, the array-type light-emitting element 54 emits a first light beam B1. The first light beam B1 has a first wavelength. The light-emitting element 58 emits a second light beam B2. The second light beam B2 has a second wavelength. The first wavelength and the second wavelength are different from each other. That is, even if the first light beam B1 and the second light beam B2 are mixed, there is no interference between the first light beam B1 and the second light beam B2. Under this circumstance, the key structure 5 is not equipped with the partition wall.

From the above descriptions, the key structure of the present invention is triggered according to the optical technology in order to generate multifunction pressure sensing signals. Since the array-type sensing element is employed to replace the sensing element of the conventional key structure, the optical resolution of the image is increased according to the technology of the present invention. That is, the control unit can perform precise judgment to generate the corresponding pressure sensing signals. The way of using the optical triggering technology has some other benefits. For example, since the conventional mechanical triggering structure is not installed in the limited inner space of the key structure, the layout space is saved and the overall volume is reduced. Consequently, the key structure can meet the slimness requirement, and the drawbacks of the conventional technologies are effectively overcome.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A key structure, comprising:
    a pedestal comprising a first pedestal opening;
    an upper cover having an upper cover opening, wherein the pedestal is covered by the upper cover;
    a first light-emitting element located under the pedestal, and emitting a first light beam, wherein the first light beam passes through the first pedestal opening;
    a triggering element arranged between the pedestal and the upper cover, wherein when the triggering element is depressed, the triggering element is moved relative to the pedestal, wherein the triggering element comprises a reflecting part, and the first light beam is reflected by the reflecting part, wherein the triggering element further comprises:
        a main body movable relative to the pedestal, wherein the reflecting part is extended externally from the main body;
        a first coupling part located at the first end of the main body, penetrated through the upper cover opening, and connected with a keycap;

a second coupling part located a second end of the main body; and a push part extended externally from the main body and located beside the second coupling part, wherein as the triggering element is moved relative to the pedestal, the spring strip is pushed by the push part;

an array-type sensing element located under the pedestal, and aligned with the first pedestal opening, wherein after the first light beam reflected by the reflecting part is received by the array-type sensing element, the array-type sensing element generates plural images, wherein the array-type sensing element comprises plural micro sensors that are arranged in an array;

a control unit electrically connected with the array-type sensing element, wherein the control unit generates a corresponding pressure sensing signal according to the plural images;

a circuit board, wherein the circuit board is located under the pedestal, and the first light-emitting element, the array-type sensing element and the control unit are supported on the circuit board; and a second light-emitting element, wherein the second light-emitting element is disposed on the circuit board and emits a second light beam, wherein the second light beam is transmitted through the triggering element to illuminate the keycap, wherein the main body, the first coupling part, the second coupling part and a part of the keycap are made of a light-transmissible material or a light-guiding material.

2. The key structure according to claim 1, wherein the pedestal further comprises a second pedestal opening, and the second pedestal opening is aligned with the second light-emitting element, wherein the second light beam is projected to the triggering element through the second pedestal opening.

3. The key structure according to claim 1, wherein the pedestal further comprises a partition wall, which is formed on a lower portion of the pedestal and arranged between the first light-emitting element and the second light-emitting element, wherein the first light beam and the second light beam are blocked by the partition wall, so that the first light beam and the second light beam are not mixed.

4. The key structure according to claim 1, wherein the first light beam from the first light-emitting element has a first wavelength, and the second light beam from the second light-emitting element has a second wavelength.

5. The key structure according to claim 1, wherein a reflective surface of the reflecting part is a curvy surface or a slant surface.

6. The key structure according to claim 1, wherein a high reflectivity layer is formed on the reflecting part and served as a reflective surface of the reflecting part.

7. The key structure according to claim 1, wherein the control unit calculates a moving speed of the reflecting part according to a result of comparing a difference between the plural images, and the control unit generates the corresponding pressure sensing signal according to the moving speed of the reflecting part.

* * * * *